(12) United States Patent
Tanaka

(10) Patent No.: US 9,372,248 B2
(45) Date of Patent: Jun. 21, 2016

(54) METHOD FOR EVALUATING RELIABILITY OF ELECTRICAL POWER MEASURING DEVICE

(75) Inventor: Ryohei Tanaka, Osaka (JP)

(73) Assignee: DAIHEN Corporation, Osaka (JP)

( * ) Notice: Subject to any disclaimer, the term of this patent is extended or adjusted under 35 U.S.C. 154(b) by 686 days.

(21) Appl. No.: 13/046,988

(22) Filed: Mar. 14, 2011

(65) Prior Publication Data

US 2011/0238360 A1    Sep. 29, 2011

(30) Foreign Application Priority Data

Mar. 23, 2010  (JP) .................. 2010-065652

(51) Int. Cl.
*G01R 35/00* (2006.01)
*G01R 21/01* (2006.01)

(52) U.S. Cl.
CPC ............... *G01R 35/00* (2013.01); *G01R 21/01* (2013.01); *G01R 35/005* (2013.01)

(58) Field of Classification Search
CPC .... G01R 35/00; G01R 35/005; G01R 35/007; G01R 21/01
USPC ....................................... 702/116
See application file for complete search history.

(56) References Cited

U.S. PATENT DOCUMENTS

| | | | | |
|---|---|---|---|---|
| 2,891,221 | A | * | 6/1959 | Bird et al. ................. 324/95 |
| 2003/0151415 | A1 | * | 8/2003 | Randall et al. ............ 324/601 |
| 2003/0213559 | A1 | * | 11/2003 | Goodman ......... H01J 37/32082 156/345.28 |
| 2007/0152678 | A1 | * | 7/2007 | Matoba et al. ............ 324/601 |
| 2011/0098954 | A1 | * | 4/2011 | Falk et al. .................. 702/62 |

FOREIGN PATENT DOCUMENTS

| | | |
|---|---|---|
| JP | 5-72311 | 3/1993 |
| JP | 2007-163308 | 6/2007 |
| WO | WO 2009/116345 | 9/2009 |
| WO | WO 2009149731 A1 * | 12/2009 |

OTHER PUBLICATIONS

MFJ, "Mobile VHF/UHF SWR/Wattmeter." MFJ Enterprises, Inc. (2006).*

(Continued)

*Primary Examiner* — Sujoy Kundu
*Assistant Examiner* — Liam R Casey
(74) *Attorney, Agent, or Firm* — Hamre, Schumann, Mueller & Larson, P.C.

(57) ABSTRACT

A method is provided for evaluating the reliability of an electrical power measuring device for measuring high-frequency electrical power. To build an evaluation system, the measuring device, together with a reference electrical power measuring device, is arranged between a high-frequency power supply device and an artificial reproduction load, which includes an impedance conversion device and a reference load. Using this system, an uncertainty range of an electrical power measured value measured by the measuring device is calculated, according to a prescribed calculation formula, from the electrical power measured value, and a judgment is made as to whether or not the electrical power measured value measured by the measuring device is within the uncertainty range. If it is within the uncertainty range, the measuring device is evaluated as being reliable, while if it is not within the uncertainty range, the measuring device is evaluated as being unreliable.

5 Claims, 5 Drawing Sheets

(56) References Cited

OTHER PUBLICATIONS

Bird Electronic Corporation, "RF Directional THRULINE Wattmeter Model 43." Bird Electronic Corpaoration (2004). p. 13.*
Orfanidis, "Electromagnetic Waves and Antennas" ECE Department, Rutgers Universirty, 2008. pp. 473-475 [online] Retrieved from Internet Wayback Machine <URL: http://web.archive.org/web/20081221044617/http://www.ece.rutgers.edu/~orfanidi/ewa/ch12.pdf> Retrieved on Aug. 9, 2013.*
Webster, "Electrical Measurement, Signal Processing, and Displays." CRC PRess LLC (2004), p. 3-8.*

* cited by examiner

METHOD FOR EVALUATING RELIABILITY OF ELECTRICAL POWER MEASURING DEVICE

BACKGROUND OF THE INVENTION

1. Field of the Invention

The present invention relates to a method for evaluating the reliability of electrical power measuring devices.

2. Description of the Related Art

In the past, plasma processing systems have been developed that process articles such as semiconductor wafers or liquid crystal substrates using a method such as etching by supplying high-frequency electrical power output from a high-frequency power supply device to a plasma processing device. In these plasma processing systems, since there is the risk of fluctuations in an impedance of the plasma processing device causing a reflected power reflected at the input end of the plasma processing device to damage the high-frequency power supply device, an impedance matching device is typically provided between the high-frequency power supply device and the plasma processing device, and the matching operation of the impedance matching device is controlled corresponding to fluctuations in the impedance of the plasma processing device, or the impedance of the plasma processing device or high-frequency voltage and high-frequency current and the like at the input end of the plasma processing device is monitored (see Japanese Patent Application Laid-open No. 2007-163308).

Monitoring the matching operation of the impedance matching device or the plasma processing device is carried out by providing a high-frequency measuring device on the output end of the impedance matching device and the input end of the plasma processing device, detecting high-frequency voltage (to be simply referred to as "voltage") and high-frequency current (to be simply referred to as "current") with the high-frequency measuring device, and in addition to determining a phase difference between the voltage and current (to be simply referred to as "phase difference") θ from the detected values, calculating high-frequency parameters such as an effective voltage value V, an effective current value I, an impedance Z=R+jX of the plasma processing device, a reflection coefficient Γ, a forward power Pf input to the plasma processing device, and a reflected power Pr reflected at the input end of the plasma processing device due to impedance mismatch, and then using those high-frequency parameters.

The high-frequency measuring device is provided with a capacitor capacitively coupled to a rod-shaped semiconductor for transmitting electrical power to the plasma processing device and a coil magnetically coupled to the body portion thereof, and together with detecting a voltage v=√2·V·sin(ωt) with the capacitor or a current i=√2·I·sin(ωt+θ) with the coil, a phase difference θ is determined from these detected values, and the high-frequency parameters are calculated according to equations (1) to (5) below using the voltage v, the current i and the phase difference θ. Namely, the high-frequency measuring device is referred to as a so-called RF sensor provided with sensors for detecting voltage v and current i, and an arithmetic processing circuit for calculating the high-frequency parameters from the detected values of those sensors.

$$R = \frac{V}{I}\cos\theta \quad (1)$$

$$X = \frac{V}{I}\sin\theta \quad (2)$$

$$Z = R + jX$$

$$\Gamma = \sqrt{\left(\frac{R^2 + X^2 - 1}{(R+1)^2 + X^2}\right)^2 + \left(\frac{2X}{(R+1)^2 + X^2}\right)^2} \quad (3)$$

$$Pf = \frac{VI\cos\theta}{1 - \Gamma^2} \quad (4)$$

$$Pr = Pf\Gamma^2 \quad (5)$$

Since values detected with sensors differ from the correct values due to variations in sensor sensitivity, monitoring devices and measuring devices are typically composed to acquire calibration data that converts detected values to correct values by preliminarily measuring a measured object serving as a reference, and then correcting detected values to correct detection values with the calibration data during actual measurement.

In the case of calibrating high-frequency measuring devices, for example, a high-frequency measuring device is arranged between a dummy load serving as a reference measured object having a characteristic impedance of the measuring system (a characteristic impedance of the transmission line over which high-frequency waves are transmitted for measurement; normally 50Ω or 75Ω) and a high-frequency power supply device, and calibration data is acquired for detected voltage values and detected current values of the high-frequency measuring device when a prescribed high-frequency electrical power is supplied from the high-frequency power supply device to the dummy load.

However, in a plasma processing system, since the load to which high-frequency electrical power is supplied from the high-frequency power supply device is plasma generated within a plasma processing device, that impedance is frequently a complex impedance having strong reactance. Although high-frequency electrical power PL actually input to the plasma processing device (to be referred to as "effective power PL") is represented as PL=Pf−Pr, as is clear from the above-mentioned equations (4) and (5), the effective power PL is calculated by PL=V·I·cos θ. According to this equation, it is difficult to correctly calculate the effective power PL supplied to a load having a complex impedance unless the effective voltage value V, the effective current value I and the phase difference θ are each calculated correctly. In particular, in a plasma processing system having for the load a plasma processing device in which the load impedance has a phase difference θ close to 90° resulting in a complex impedance having large reflection, since the error in the effective power PL becomes extremely large even if there is only a slight error in the phase difference θ, it is difficult to measure effective power PL with high reliability in high-frequency measuring devices.

In a system in which high-frequency electrical power is supplied from a high-frequency power supply device to a load having a complex impedance with extremely large reflection in the manner of a plasma processing system, when the reliability of a measured value of effective power PL supplied to the load by a high-frequency measuring device is attempted to be evaluated, although it is necessary to employ a method in which, for example, a measured value is set for effective power PL that serves as a reference when a prescribed high-frequency electrical power is supplied to a load having a complex impedance, and a measured value of the effective power PL of the high-frequency measuring device is evaluated by comparing with the reference measured value, such a method for evaluating the reliability of an electrical power measured value of a high-frequency measuring device has yet to be proposed.

Consequently, there has previously been the problem of being unable to evaluate the reliability of high-frequency measuring devices for measuring the effective power input to a load having a complex impedance. In addition, since criteria for evaluating reliability during manufacturing of high-frequency measuring devices are not clearly defined, it was also difficult to inspect for defective products.

SUMMARY OF THE INVENTION

With the foregoing in view, an object of the present invention is to provide a method for evaluating the reliability of an electrical power measuring device used for a load other than that having a characteristic impedance.

The present invention devises the following technical means for solving the above-mentioned problems.

A method for evaluating the reliability of electrical power measuring devices provided according to a first aspect of the present invention is a method for evaluating, using a prescribed evaluation system, the reliability of an electrical power measuring device that is connected to a connection point between a high-frequency power supply device and a load having a complex impedance to which high-frequency electrical power is supplied from the high-frequency power supply device, and measures the high-frequency electrical power at the connection point. The evaluation system is configured by terminating a transmission line of high-frequency electrical power output from the high-frequency power supply device at a dummy load reproduction device that artificially reproduces the load, and arranging an electrical power measuring device to be evaluated and a reference electrical power measuring device enabling calculation of the uncertainty of an electrical power measured value between the high-frequency power supply device and the dummy load reproduction device. An uncertainty range of the electrical power measured value is calculated according to a prescribed calculation formula from an electrical power measured value measured by the reference electrical power measuring device and the uncertainty of the reference electrical power measuring device. A judgment is made as to whether or not the electrical power measured value measured by the electrical power measuring device to be evaluated is within the uncertainty range of the electrical power measured value of the reference electrical power measuring device, and the electrical power measuring device to be evaluated is evaluated as being reliable if the electrical power measured value of the electrical power measuring device to be evaluated is within the uncertainty range of the electrical power measured value of the reference electrical power measuring device.

Furthermore, the term "uncertainty" refers to a parameter that characterizes the variation of a value able to be logically correlated with a measured quantity incidental to a measurement result, and indicates to what degree of range of variation from a measured value a "true value" is present. In addition, the range over which this "true value" is able to be present is referred to as the "uncertainty range".

In a preferred embodiment of the present invention, a measured value of forward power transmitted from the high-frequency power supply device to the dummy load reproduction device and a measured value of reflected power transmitted from the dummy load reproduction device to the high-frequency power supply device are included in the electrical power measured values of the electrical power measuring device to be evaluated and the reference electrical power measuring device, and the reliability of the electrical power measuring device to be evaluated is evaluated by judging whether or not the electrical power measured value of the electrical power measuring device to be evaluated is within the uncertainty range of the electrical power measured value of the reference electrical power measuring device respectively for the forward power and reflected power.

In a preferred embodiment of the present invention, the dummy load reproduction device has a variable reactance element, and a plurality of complex impedances can be set by adjusting a reactance value of the variable reactance element.

A method for evaluating the reliability of electrical power measuring devices provided according to a second aspect of the present invention is a method for evaluating, using a prescribed evaluation system, the reliability of an electrical power measuring device that is connected to a connection point between a high-frequency power supply device and a load having a complex impedance to which high-frequency electrical power is supplied from the high-frequency power supply device, and measures the high-frequency electrical power at the connection point. The evaluation system is configured by terminating a transmission line of high-frequency electrical power output from the high-frequency power supply device at a reference load having an impedance equal to a characteristic impedance of the transmission line, arranging an electrical power measuring device to be evaluated and a reference electrical power measuring device enabling calculation of the uncertainty of an electrical power measured value in the transmission line, arranging, after the electrical power measuring device to be evaluated and the reference electrical power measuring device, a first impedance conversion device that converts an impedance so that an impedance as viewed towards the reference load side becomes a complex impedance together with arranging a first electrical power measuring device that measures electrical power input to the reference load between the first impedance conversion device and the reference load, and arranging, before the electrical power measuring device to be evaluated and the reference electrical power measuring device, a second impedance conversion device that converts an impedance so that an impedance as viewed towards the reference load side becomes a characteristic impedance together with arranging a second electrical power measuring device that measures electrical power output from the high-frequency power supply device between the second impedance conversion device and the high-frequency power supply device. An uncertainty range of the electrical power measured value is calculated according to a prescribed calculation formula from an electrical power measured value measured by the reference electrical power measuring device and the uncertainty of the reference electrical power measuring device, and a prescribed electrical power measuring range is calculated based on an electrical power measured value measured by the first electrical power measuring device and an electrical power measured value measured by the second electrical power measuring device, and the reliability of the electrical power measuring device to be evaluated is evaluated based on the electrical power measured value measured by the electrical power measuring device to be evaluated, the uncertainty range of the electrical power measured value of the reference electrical power measuring device, and the prescribed electrical power measuring range.

In a preferred embodiment of the present invention, the prescribed electrical power measuring range is a range between an electrical power measured value of the first electrical power measuring device and an electrical power measured value of the second electrical power measuring device.

In a preferred embodiment of the present invention, the prescribed electrical power measuring range is a prescribed range centered on a median value of an electrical power measured value of the first electrical power measuring device and an electrical power measured value of the second electrical power measuring device.

In a preferred embodiment of the present invention, a judgment is made as to whether the uncertainty range of the electrical power measured value of the reference electrical power measuring device is narrower than the prescribed electrical power measuring range, and in the case the uncertainty range is narrower than the prescribed electrical power measuring range, the electrical power measuring device to be evaluated is evaluated as being reliable if the electrical power measured value of the electrical power measuring device to be evaluated is within the uncertainty range of the electrical power measured value of, the reference electrical power measuring device, while in the case the uncertainty range is not narrower than the prescribed electrical power measuring range, the electrical power measuring device to be evaluated is evaluated as being reliable if a difference between a measured value of forward power transmitted to the side of the reference load, which is the electrical power measured value of the electrical power measuring device to be evaluated, and a measured value of reflected power transmitted to the side of the high-frequency power supply device, is within the prescribed electrical power measuring range.

In a preferred embodiment of the present invention, the reference electrical power measuring device is provided with a directional coupler, and forward power and reflected power separated with the directional coupler are respectively measured.

In a preferred embodiment of the present invention, an uncertainty range FPW of a forward power measured value and an uncertainty range RPW of a reflected power measured value of the reference electrical power measuring device are calculated with the calculation formulas indicated below:

$$FPW = Pf \times (100-FPU)/100 \text{ to } Pf \times (100+FPU)/100$$

$$RPW = Pr \times (100-RPU)/100 \text{ to } Pr \times (100+RPU)/100$$

where
Pf: Forward power measured value
Pr: Reflected power measured value
±FPU: Forward power uncertainty
±RPU: Reflected power uncertainty
FPU=2×C×ρl×100 (%)
RPU=200×(A+(A+C)×ρl+(ρs×ρl×ρl)) (%)
A: Forward directivity of the directional coupler
C: Reflection coefficient of the directional coupler as viewed from the high-frequency power supply device side
ρs: Reflection coefficient of the directional coupler as viewed from the load side
ρl: Reflection coefficient of the load as viewed from the directional coupler Furthermore, "reflection coefficients" are more precisely represented by the magnitude (absolute value) and phase thereof, and are described as "reflection coefficients" even in the case of referring only the magnitude of thereof. The reflection coefficients C, ρs and ρl represent the magnitude of those reflection coefficients. In addition, directivity A represents the magnitude of directivity.

In a preferred embodiment of the present invention, the electrical power measuring device to be evaluated is a high-frequency measuring device that measures a high-frequency voltage and a high-frequency current, and calculates at least one of a phase difference between the high-frequency voltage and the high-frequency current, an impedance, a reflection coefficient, forward power and reflected power from these measured values.

According to the present invention, high-frequency electrical power supplied from a high-frequency power supply device to a dummy load having a complex impedance (that includes a forward power and a reflected power) is respectively measured by an electrical power measuring device to be evaluated and a reference electrical power measuring device. In the reference electrical power measuring device, an uncertainty range of an electrical power measured value is calculated according to a prescribed calculation formula from the electrical power measured value. Since the electrical power measuring device to be evaluated and the reference electrical power measuring device measure high-frequency electrical power transmitted along the same transmission line, if an electrical power measured value of the electrical power measuring device to be evaluated is within the uncertainty range of an electrical power measured value of the reference electrical power measuring device, then the electrical power measured value of the electrical power measuring device to be evaluated can be judged to be reliable, and the electrical power measuring device to be evaluated can be evaluated as being reliable.

Namely, if an electrical power measured value of the electrical power measuring device to be evaluated is defined as "Pf1", an electrical power measured value of the reference electrical power measuring device is defined as "Pf2", and the uncertainty range of the electrical power measured value Pf2 is defined as "Pf2±ΔUf", the electrical power measuring device to be evaluated is evaluated as being reliable if Pf2−ΔUf≤Pf1≤Pf2+ΔUf.

As a result, an electrical power measured value measured by an electrical power measuring device evaluated as being reliable can be guaranteed to be reliable. In addition, inspections for defective products can be preferably carried out by evaluating the reliability of an electrical power measuring device during manufacturing of that electrical power measuring device.

In addition, according to the present invention, a first impedance conversion device, which converts a reference load to a complex impedance, and a second impedance conversion device, which further converts the complex impedance to a characteristic impedance, are provided on a transmission line in which high-frequency electrical power is supplied from a high-frequency power supply device to a reference load having an impedance equal to the characteristic impedance, and high-frequency electrical power (including forward power, reflected power and differential electrical power between the forward power and the reflected power) is respectively measured by an electrical power measuring device to be evaluated and a reference electrical power measuring device on the transmission line between the first and second impedance conversion devices. In addition, high-frequency electrical power (forward power) input to the reference load is measured by a first electrical power measuring device between the reference load and the first impedance conversion device, and high-frequency electrical power (reflected power) output from the high-frequency power supply device is measured by a second electrical power measuring device between the high-frequency power supply device and the second impedance conversion device.

An uncertainty range of a measured value of high-frequency electrical power is calculated according to a prescribed calculation formula from a measured value of high-frequency electrical power of a reference electrical power measuring device and the uncertainty of the reference electrical power measuring device. In addition, a prescribed electrical power measuring range is calculated based on a measured value of high-frequency electrical power of the first electrical power measuring device and a measured value of high-frequency electrical power of the second electrical power measuring device.

In the case the uncertainty range of the measured value of high-frequency electrical power of the reference electrical power measuring device is narrower than the prescribed electrical power measuring range, an electrical power measuring device to be evaluated is evaluated as being reliable if an electrical power measured value of the electrical power measuring device to be evaluated is within the uncertainty range of the electrical power measured value of the reference electrical power measuring device. On the other hand, in the case the uncertainty range of a measured value of high-frequency electrical power of the reference electrical power measuring device is not narrower than the prescribed electrical power measuring range, the electrical power measuring device to be evaluated is evaluated as being reliable if the difference between a measured value of forward power and a measured value of reflected power of the electrical power measuring device to be evaluated is within the prescribed electrical power measuring range.

Namely, if measured values of forward power and reflected power of the electrical power measuring device to be evaluated are defined as "Pf1" and "Pr1", the prescribed electrical power measuring range is defined as "Pf3 to Pf4" (<Pf3), measured values of forward power and reflected power of the reference electrical power measuring device are defined as "Pf2" and "Pr2", the uncertainty range of the measured value Pf2 of forward power is defined as "Pf2±ΔUf", and the uncertainty range of the measured value Pr2 of reflected power is defined as "Pr2±ΔUr", in the case of 2·(ΔUf+ΔUr)<(Pf3−Pf4), the electrical power measuring device to be evaluated is evaluated as being reliable if Pf2−ΔUf≤Pf1≤Pf2+ΔUf, while in the case of 2·(ΔUf+ΔUr)≥(Pf4−Pf3), the electrical power measuring device to be evaluated is evaluated as being reliable if Pf4<(Pf1−Pr1)<Pf3.

Thus, since the reliability of an electrical power measuring device to be evaluated is evaluated under stricter conditions, the reliability of the electrical power measuring device to be evaluated can be evaluated more severely.

Other characteristics and advantages of the present invention will become clearer from the detailed explanation provided below with reference to the appended drawings.

DESCRIPTION OF THE PREFERRED EMBODIMENTS

The following provides a detailed explanation of embodiments of the present invention with reference to the appended drawings.

Figure 1:
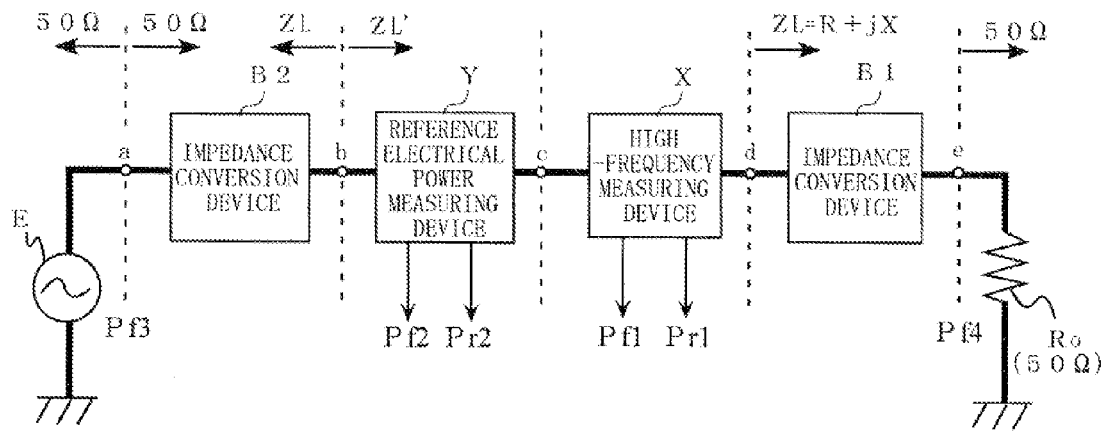
FIG. 1 is a drawing for explaining the concept of a first embodiment of the evaluation method according to the present invention.

FIG. 1 is a drawing for explaining the concept of a first embodiment of a method for evaluating measurement accuracy of a high-frequency measuring device according to the present invention.

An electrical power measuring system for evaluating electrical power measurement accuracy of a high-frequency measuring device employs a configuration in which a transmission line of high-frequency electrical power output from a high-frequency power supply E is terminated at a termination resistor Ro having a characteristic impedance (for example, 50Ω) of an electrical power measuring system, high-frequency measuring device X to be evaluated and a high-frequency electrical power measuring device serving as an evaluation reference capable of calculating the uncertainty of a measured value (to be referred to as a "reference electrical power measuring device") Y are arranged in series at an intermediate location of the transmission line, and together with arranging an impedance conversion device B1 between the high-frequency measuring device X and the termination resistor Ro, an impedance conversion device B2 is arranged between the reference electrical power measuring device Y and the high-frequency power supply E. Furthermore, the high-frequency measuring device X fulfills the same function as an RF sensor explained in the prior art.

The impedance conversion device B1 is for converting an impedance of the termination resistor Ro so that an impedance viewed from the output end d of the high-frequency measuring device X towards the load side becomes a desired complex impedance ZL=R+jX. In addition, the impedance conversion device B2 is for converting the impedance ZL=R'+jX' as viewed from the input end b of the reference electrical power measuring device Y towards the load side so that an impedance as viewed from the output end a of the high-frequency power supply E towards the load side becomes a characteristic impedance Ro.

Furthermore, since the input and output impedances of the high-frequency measuring device X and the reference electrical power measuring device Y are designed to be the characteristic impedance Ro, an impedance of the electrical power measuring system shown in FIG. 1 is laterally symmetrical about a central point c. Thus, in the case of configuring such that the input and output sides of the impedance conversion device B2 on the side of the high-frequency power supply E are inversely connected in the same circuit as the impedance conversion device B1 on the load side, an impedance as viewed from the output end b of the impedance conversion device B2 towards the power supply side is equal to the complex impedance ZL=R+jX as viewed from the input end d of the impedance conversion device B1 towards the load side.

The basis of the evaluation method according to a first embodiment consists of respectively measuring forward power and reflected power flowing through a transmission line on a transmission line having a complex impedance ZL positioned between both ends thereof with the high-frequency measuring device X and the reference electrical power measuring device Y, calculating uncertainty ranges Pf2±ΔUf (provided that, ΔUf=Pf2·FPU/100) and Pr2±ΔUr (provided that, ΔUr=Pr2·RPU/100) of forward power measured value Pf2 and reflected power measured value Pr2 of the reference electrical power measuring device Y from the forward power Pf2 and the reflected power Pr2 and their respective uncertainties ±FPU (%) and ±RPU (%), and respectively comparing the forward power measured value Pf1 and the reflected power measured value Pr1 measured with the high-frequency measuring device X with the uncertainty range Pf2±ΔUf of the forward power measured value Pf2 and the uncertainty range Pr2±ΔUr of the reflected power measured value Pr2, and if the forward power Pf1 is within the uncertainty range Pf2±ΔUf and the reflected power Pr1 is within the uncertainty range Pr2±ΔUr, then the forward power measured value Pf1 and the reflected power measured value Pr1 of the high-frequency measuring device X can be judged to be reliable, and the high-frequency measuring device X can be evaluated as being reliable.

Namely, when the reference electrical power measuring device Y, for which uncertainty of electrical power measured values is clear, is used as a reference, if an electrical power measured value of the high-frequency measuring device X measured under identical conditions is within the uncertainty range of electrical power measured values of the reference electrical power measuring device Y, then the high-frequency measuring device X is evaluated as being reliable.

Furthermore, in the case the uncertainty range of electrical power measured values of the reference electrical power measuring device Y is broad, the reliability of the high-frequency measuring devices X becomes low even if an electrical power measured value of the high-frequency measuring device X is within the uncertainty range of electrical power measured values of the reference electrical power measuring device Y. Thus, in the evaluation method according to the first embodiment, an electrical power Pf3 and Pf4 are respectively measured at the output end a of the high-frequency power supply E and an input end e of the termination resistor Ro, and in the case the range Pf3 to Pf4 (>Pf3) of both electrical power measured values is narrower than the uncertainty range of electrical power measured values of the reference electrical power measuring device Y, reliability of the high-frequency measuring device X is evaluated based on the range Pf3 to Pf4 of the electrical power measured values as described below.

Namely, since impedance matching is obtained at the output end a of the high-frequency power supply E, the detected electrical power Pf3 at the output end a can be considered to essentially be forward power, and the detected electrical power Pf3 is equivalent to a difference PL between forward power and reflected power at an output end c of the of the reference electrical power measuring device Y. On the other hand, although the difference PL is the electrical power input to the termination resistor Ro, since impedance matching is obtained at the input end e of the termination resistor Ro, detected electrical power Pf4 at the input end e can be considered to essentially be forward power, and the difference PL is equivalent to the detected electrical power Pf4. Since the impedance conversion devices B1 and B2 have extremely low power loss, Pf4<PL<Pf3 ought to theoretically be valid. Thus, if the difference (Pf1−Pr1) between the forward power Pf1 and the reflected power Pr1 measured with the high-frequency measuring device X is within the range of Pf4<(Pf1−Pr1)<Pf3, then the high-frequency measuring device X can be evaluated as being reliable.

If the inequality 2·(ΔUf+ΔUr)>(Pf3−Pf4) is valid between measured electrical power measured values Pf3 and Pf4 and the uncertainty range (Pf2−Pr2)±(ΔUf+ΔUr) of the difference between forward power measured value Pf2 and reflected power measured value Pr2 of the reference electrical power measuring device Y, since the range Pf3 to Pf4 of both electrical power measured values is narrower than the uncertainty range of electrical power measured values of the reference electrical power measuring device Y, a judgment is made as to whether or not Pf4<(Pf1−Pr1)<Pf3 is valid. At this time, if Pf4<(Pf1−Pr1)<Pf3 is valid, then the high-frequency measuring device X is evaluated as being reliable.

Thus, in the evaluation method according to the first embodiment, the uncertainty range (Pf2−Pr2)±(ΔUf+ΔUr) of the difference between measured values Pf2 and Pr2 of forward power and reflected power of the reference electrical power measuring device Y is calculated using the measured values Pf2 and Pr2 and known uncertainties ±FPU (%) and ±RPU (%), and a judgment is made as which of the difference uncertainty range (Pf2−Pr2)±(ΔUf+ΔUr) or the range Pf3 to Pf4 of both electrical power measured values at the input end a and the output end e is narrower. In the case the difference uncertainty range (Pf2−Pr2) (ΔUf+ΔUr) is narrower, reliability is evaluated by comparing the forward power measured value Pf1 of the high-frequency measuring device X with the uncertainty range Pf2±ΔUf and comparing the reflected power measured value Pr1 with the uncertainty range Pr2±ΔUr, while in the case the range Pf3 to Pf4 of both electrical power measured values is narrower, reliability is evaluated by comparing the difference (Pf1−Pr1) between the forward power measured value Pf1 and the reflected power measured value Pr1 of the high-frequency measuring device X with the electrical power measuring range Pf3 to Pf4.

Next, an explanation is provided of an evaluation system for evaluating the reliability of a high-frequency measuring device using the evaluation method according to the first embodiment.

Figure 2:
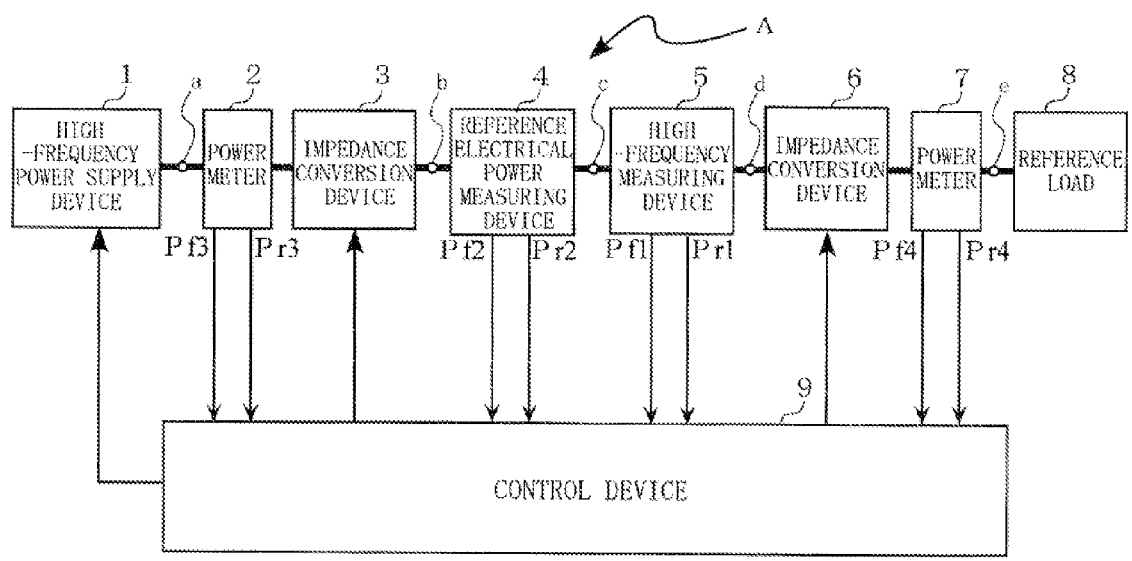
FIG. 2 is a drawing showing an example of an evaluation system for carrying out a first embodiment of the evaluation method according to the present invention.

FIG. 2 is a drawing showing the configuration of an evaluation system for carrying out the evaluation method according to the first embodiment.

As shown in this drawing, an evaluation system A is provided with a high-frequency power supply device 1, a power meter 2, an impedance conversion device 3, a reference electrical power measuring device 4, a high-frequency measuring device 5, an impedance conversion device 6, a power meter 7, a reference load 8 and a control device 9. The evaluation system A evaluates the reliability of the high-frequency measuring device 5, evaluates the high-frequency measuring device 5 as being reliable in the case an electrical power measured value of the high-frequency measuring device 5 is within a prescribed range, or evaluates the high-frequency measuring device 5 as being unreliable in the case an electrical power measured value of the high-frequency measuring device 5 is outside the prescribed range. The high-frequency power supply device 1, the power meter 2, the impedance conversion device 3, the reference electrical power measuring device 4, the high-frequency measuring device 5, the impedance conversion device 6, the power meter 7 and the reference load 8 are respectively connected on a transmission line composed of, for example, a coaxial cable in that order. Furthermore, the arrangement of the reference electrical power measuring device 4 and the high-frequency measuring device 5 may be inverted. In addition, the evaluation system A is configured as an electrical power measuring system having a characteristic impedance of 50 Ω.

The high-frequency power supply device 1 supplies high-frequency electrical power, and is a power supply device capable of outputting high-frequency electrical power having a frequency of, for example, several hundred kHz or more. A high-frequency power supply device similar to that typically used in plasma processing of a plasma processing device is used for the high-frequency power supply device 1.

The power meter 2 measures forward power from the high-frequency power supply device 1 and reflected power from the impedance conversion device 3 at the output end a of the high-frequency power supply device 1. The forward power Pf3 and the reflected power Pr3 measured by the power meter 2 are input to the control device 9. The power meter 7 measures forward power from the impedance conversion device 6 and reflected power from the reference load 8 at the input end e of the reference load 8. The forward power Pf4 and the reflected power Pr4 measured by the power meter 7 are input to the control device 9. In the present embodiment, the power meter 2 and the power meter 7 are electrical power measuring devices that use directional couplers, and are configured in the same manner as the reference electrical power measuring device 4 to be subsequently described. Furthermore, since the power meter 2 and the power meter 7 measure the forward power Pf3 and Pf4 when the reflected power Pr3 and Pr4 are at zero, even if the directivity of the directional couplers is not as high as the reference electrical power measuring device 4, the measurement accuracy of the measured forward power Pf3 and Pf4 is sufficiently high (for example, within ±1%). Furthermore, the power meter 2 and the power meter 7 are suitably calibrated, and the electrical power measured values output thereby are output as correct values. Furthermore, the power meter 2 and the power meter 7 are not limited thereto, but rather may be any electrical power measuring device that measures forward power and reflected power.

When the reflected power Pr3 and the reflected power Pr4 are at zero, electrical power output by the high-frequency power supply device 1 is input to the impedance conversion device 3 without being reflected, and electrical power output by the impedance conversion device 6 is input to the reference load 8 without being reflected. At this time, the forward power Pf3 measured by the power meter 2 and the forward power Pf4 measured by the power meter 7 are measured with sufficiently high accuracy. In addition, as was previously described, the difference PL between forward power and reflected power measured at a location between the output end b and the input end d ought to be between the forward power Pf3 measured by the power meter 2 and the forward power Pf4 measured by the power meter 7. In the present embodiment, the reliability of the high-frequency measuring device 5 is evaluated according to whether or not the difference (Pf1−Pr1) between the forward power Pf1 and reflected power Pr1 measured with the high-frequency measuring device 5 is within the range between the forward power Pf3 and the forward power Pf4.

The impedance conversion devices 3 and 6 are for converting an impedance. The impedance conversion device 6 is for reproducing the actual complex impedance generated in the plasma processing device used by the high-frequency measuring device 5, and converts an impedance of the reference load 8 so that an impedance viewed from the input end c of the high-frequency measuring device 5 towards the side of the reference load 8 becomes a desired complex impedance. Since the actual complex impedance generated in the plasma processing device changes over a fixed range, a variable reactance element is contained in the impedance conversion device 6 so as to be able to reproduce a plurality of representative values of that range of change, and a plurality of representative values (complex impedances) are reproduced by changing the variable reactance element.

Figure 3:
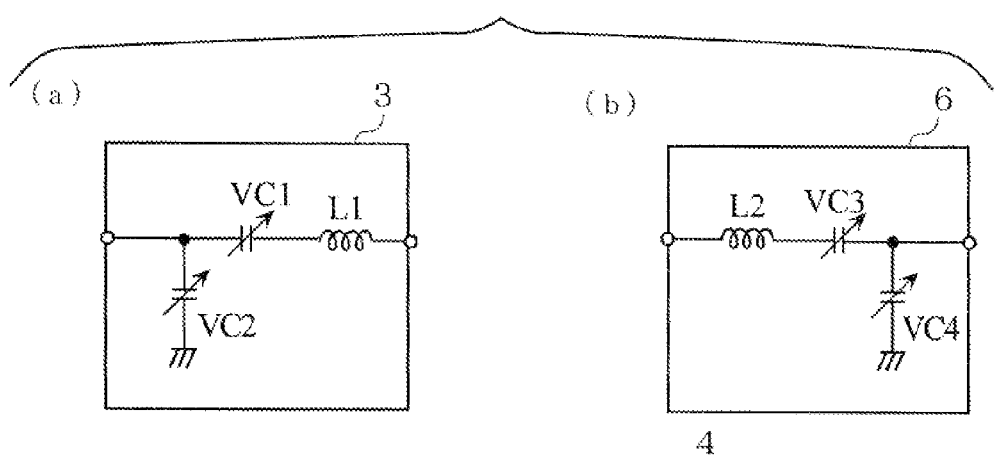
FIG. 3 consists of circuit diagrams showing examples of a variable load device.

FIG. 3(*b*) is a circuit diagram showing an example of the impedance conversion device 6.

As shown in FIG. 3(*b*), the impedance conversion device 6 has an inductor L2 and variable reactance elements in the form of variable capacitors VC3 and VC4 connected in an L configuration. The capacitances C3 and C4 of the variable capacitors VC3 and VC4 can be changed in a stepwise manner. The impedance conversion device 6 converts an impedance of the reference load 8 so that an impedance viewed from the input end c of the high-frequency measuring device 5 towards the side of the reference load 8 becomes a desired complex impedance by changing the capacitances C3 and C4 to vary the impedance.

Adjustment values of the capacitances C3 and C4 for reproducing a plurality of complex impedances are preset in the following manner using an impedance analyzer. First, the portion of the evaluation system A shown in FIG. 2 from the high-frequency power supply device 1 to the reference electrical power measuring device 4 is removed, and the impedance analyzer is connected to the input end c of the high-frequency measuring device 5. The capacitances C3 and C4 of the variable capacitors VC3 and VC4 are then changed while monitoring the measured values of the impedance analyzer. Adjustment positions of the variable capacitors VC3 and VC4 (values of the capacitances C3 and C4) are acquired when the measured value of the impedance analyzer becomes a desired complex impedance, and set for the impedance conversion device 6. As a result, the impedance conversion device 6 is able to reproduce a desired complex impedance.

The impedance conversion device 3 matches a complex impedance converted with the impedance conversion device 6 to the high-frequency power supply device 1, and converts an impedance viewed from the input end b of the reference electrical power measuring device 4 towards the load side so that an impedance viewed from the output end a of the high-frequency power supply device 1 towards the side of the reference load 8 becomes a characteristic impedance. A variable reactance element is contained in the impedance conversion device 3, and an impedance viewed from the output end a of the high-frequency power supply device 1 towards the side of the reference load 8 is converted to a characteristic impedance by changing the variable reactance element.

FIG. 3(*a*) is a circuit diagram showing an example of the impedance conversion device 3.

As shown in FIG. 3(*a*), the impedance conversion device 3 has an inductor L1 and variable reactance elements in the form of variable capacitors VC1 and VC2 connected in an L configuration. The capacitances C1 and C2 of the variable capacitors VC1 and VC2 can be changed in a stepwise manner. The impedance conversion device 3 converts an impedance viewed from the output end a of the high-frequency power supply device 1 towards the side of the reference load 8 to a characteristic impedance by changing the capacitances C1 and C2 to vary the impedance.

The inductor L1, variable capacitor VC1 and variable capacitor VC2 of the impedance conversion device 3 respectively use elements in common with the inductor L2, variable capacitor VC3 and variable capacitor VC4 of the impedance conversion device 6. In addition, as shown in the drawing, in the impedance conversion device 3, in contrast to the inductor L1 and the variable capacitor VC1 being connected in series in that order from the input side and the variable capacitor VC2 being connected in parallel there from to the output side, in the impedance, conversion device 6, the inductor L2 and the variable capacitor VC3 are connected in series in that order from the output side and the variable capacitor VC4 is connected in parallel there from to the input side. Namely, the impedance conversion device 6 can be considered as having interchanged the input side and output side from that of the impedance conversion device 3. As a result, if the capacitance C1 of the variable capacitor VC1 and the capacitance C2 of the variable capacitor VC2 are respectively made to coincide with the capacitance C3 of the variable capacitor VC3 and the capacitance C4 of the variable capacitor VC4, an impedance viewed from the output end a of the high-frequency power supply device 1 towards the side of the reference load 8 can theoretically be matched to a characteristic impedance that is the impedance of the reference load 8. Furthermore, since there is actually variation between elements, the impedance is not made to completely match, but rather serves as a reference for adjustment.

Furthermore, the configuration of the impedance conversion devices 3 and 6 is not limited thereto, but is only required to be that which enables conversion of an impedance. For example, the variable reactance element may be in the form of variable inductance. In addition, when not considering the bother of adjustment, the arrangement of elements of the impedance conversion device 3 and the arrangement of elements of the impedance conversion device 6 are not required to be mutually symmetrical.

The reference electrical power measuring device 4 measures forward power from the impedance conversion device 3 and reflected power of the impedance conversion device 6 at the input end c of the high-frequency measuring device 5. The forward power Pf2 and the reflected power Pr2 measured by the reference electrical power measuring device 4 are input to the control device 9.

Figure 4:
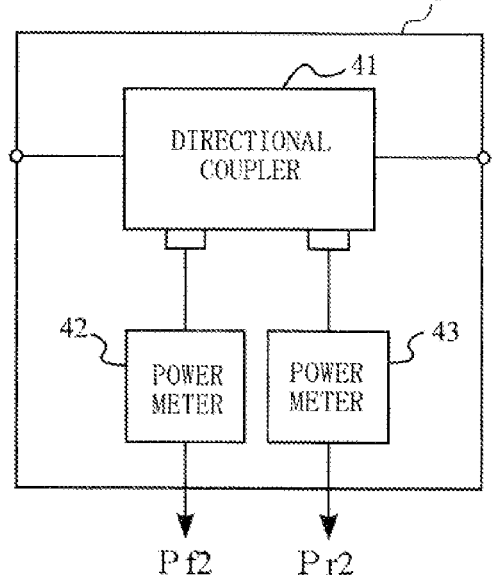
FIG. 4 is a drawing showing an example of the configuration of a reference electrical power measuring device.

FIG. 4 is a drawing showing an example of the configuration of the reference electrical power measuring device 4.

As shown in the drawing, the reference electrical power measuring device 4 is provided with a directional coupler 41, a power meter 42 and a power meter 43. The directional coupler 41 separates electrical power into a forward wave and a reflected wave and outputs each wave. The power meter 42 is a terminated power meter that measures and outputs forward power Pf2 from the forward wave input by the directional coupler 41. The power meter 43 is also a terminated power meter, and measures and outputs reflected power Pr2 from the reflected wave input from the directional coupler 41. Furthermore, the power meter 42 and the power meter 43 are suitably calibrated, and electrical power measured values output thereby are output as correct values. Furthermore, the above-mentioned power gauges 2 and 7 also have a similar configuration to those of the reference electrical power measuring device 4.

Since measured values measured by the reference electrical power measuring device 4 serve as a reference for evaluating electrical power measured values of the high-frequency measuring device 5, it is necessary to use a device having high measurement accuracy for the reference electrical power measuring device 4. In the present embodiment, a direction coupler having high directivity (for example, about −50 dB) is used for the directional coupler 41 of the reference electrical power measuring device 4. Furthermore, the configuration of the reference electrical power measuring device 4 is not limited thereto, but rather may be that of any electrical power measuring device that is capable of accurately measuring forward power and reflected power and enables calculation of uncertainty.

In general, the uncertainty of a directional coupler is calculated according to the following equation (6). The uncertainty of an electrical power measuring device provided with a directional coupler can be considered to be equal to the uncertainty of the directional coupler. Thus, the uncertainty of the reference electrical power measuring device 4 is calculated according to the following equation (6) using each parameter of the directional coupler 41:

$$\pm FPU = \pm 2 \times C \times \rho l \times 100 (\%)$$

$$\pm RPU = \pm 200 \times (A + (A+C) \times \rho l + (\rho s \times \rho l \times \rho l))(\%) \quad (6)$$

±FPU: Forward power uncertainty
±RPU: Reflected power uncertainty
A: Forward directivity of the directional coupler
C: Reflection coefficient of the directional coupler as viewed from the power supply
ρs: Reflection coefficient of the directional coupler as viewed from the load
ρl: Reflection coefficient of the load as viewed from the directional coupler The forward directivity A of the directional coupler, the reflection coefficient C of the directional coupler as viewed from the power supply, and the reflection coefficient ρs of the directional coupler as viewed from the load differ according to the directional coupler used and are determined in advance. The reflection coefficient ρl of the load as viewed from the directional coupler is measured using a network analyzer when setting a desired complex impedance for the impedance conversion device 6.

The "true value" of measured values of an electrical power measuring device for which uncertainty has been calculated is within the uncertainty range calculated from the measured value and the uncertainty. For example, in the case forward power Pf2 is measured by the reference electrical power measuring device 4, the "true value" can be considered to be between Pf2·(100−FPU)/100 and Pf2·(100+FPU)/100. In the present embodiment, reliability of the high-frequency measuring device 5 is evaluated based on whether or not the forward power Pf1 and the reflected power Pr1 measured by the high-frequency measuring device 5 are respectively within the uncertainty ranges of forward power Pf2 and reflected power Pr2 measured by the reference electrical power measuring device 4. Furthermore, the equation for calculating uncertainty is not limited to the equation (6) described above.

The high-frequency measuring device 5 is an electrical power measuring device for which reliability is evaluated by the evaluation system A. The high-frequency measuring device 5 measures forward power from the impedance conversion device 3 and reflected power from the impedance conversion device 6 at the output end c of the reference electrical power measuring device 4. The high-frequency measuring device 5 is a so-called RF sensor that detects voltage and current of a transmission line at the output end c and calculates forward power Pf1 and reflected power Pr1 using the previously described equations (1) to (5). Forward power Pf1 and reflected power Pr1 measured by the high-frequency measuring device 5 are input to the control device 9.

Figure 5:
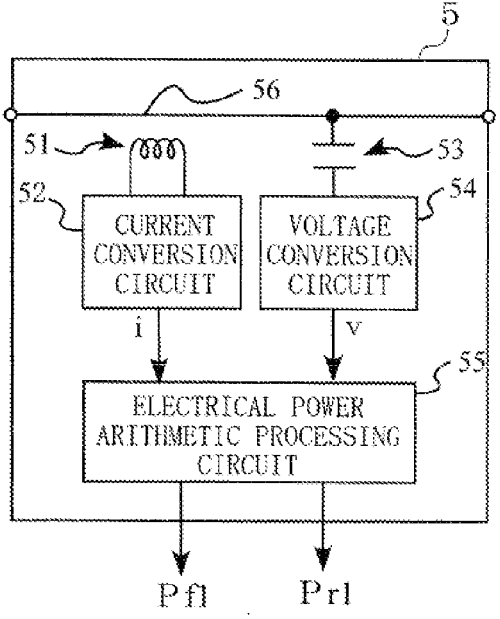
FIG. 5 is a drawing showing an example of the configuration of a high-frequency measuring device.

FIG. 5 is a drawing showing an example of the configuration of the high-frequency measuring device 5.

As shown in the drawing, the high-frequency measuring device 5 is provided with a current transformer unit 51, a current conversion circuit 52, a capacitor unit 53, a voltage conversion circuit 54 and an electrical power arithmetic processing circuit 55. The current transformer unit 51 detects current corresponding to high-frequency current flowing to a transmission line 56, and the detected current is output to the current conversion circuit 52. The current conversion circuit 52 converts the input current to a current signal i of a prescribed current level and outputs that current signal i to the electrical power arithmetic processing circuit 55. The capacitor unit 53 detects voltage corresponding to high-frequency voltage generated in the transmission line 56, and outputs the detected voltage to the voltage conversion circuit 54. The voltage conversion circuit 54 converts the input voltage to a voltage signal v of a prescribed voltage level and outputs that signal to the electrical power arithmetic processing circuit 55. The electrical power arithmetic processing circuit 55 determines a phase difference θ from the current signal i input from the current conversion circuit 52 and the voltage signal v input from the voltage conversion circuit 54, and calculates an effective voltage value V and a an effective current value I. In addition, the electrical power arithmetic processing circuit 55 calculates and outputs forward power Pf1 and reflected power Pr1 using the previously described equations (1) to (5) from the phase difference θ, the effective voltage value V and the effective current value I. Furthermore, the current conversion circuit 52 and the voltage conversion circuit 54 are suitably calibrated, and the current signal i and the voltage signal v output thereby are output as correct values.

The reference load 8 is a so-called reflection-free termination, and is for terminating a transmission line of electrical power output from the high-frequency power supply device 1 in the absence of reflection.

The control device 9 controls the evaluation system A. The control device 9 is input with respective measured values of forward power and reflected power from the power meter 2, the reference electrical power measuring device 4, the high-frequency measuring device 5 and the power meter 7, evaluates reliability of the high-frequency measuring device 5, and displays the evaluation result on a display unit not shown. The control unit 9 judges which range of the i uncertainty range of the difference between forward power Pf2 and reflected power Pr2 input from the reference electrical power measuring device 4 and the range between forward power Pf3 input from the power meter 2 and forward power Pf4 input from the power meter 7 is narrower when the reflected power Pr3 input from the power meter 2 and the reflected power Pr4 input from the power meter 7 are at zero. This is for evaluating the reliability of the high-frequency measuring device 5 more severely by comparing electrical power measured values of the high-frequency measuring device 5 under stricter conditions (conditions having a narrower range).

In the case the uncertainty range of the difference between forward power Pf2 and reflected power Pr2 is narrower, the control device 9 evaluates reliability of the high-frequency measuring device 5 based on whether or not the forward power Pf1 and the reflected power Pr1 are respectively within the uncertainty ranges of the forward power Pf2 and the reflected power Pr2. In the present embodiment, the control device 9 evaluates the high-frequency measuring device 5 as being reliable only in the case the forward power Pf1 is within the uncertainty range of the forward power Pf2 and the reflected power Pr1 is within the uncertainty range of the reflected power Pr2. Furthermore, evaluation of reliability is not limited thereto. For example, the high-frequency measuring device may be evaluated as being reliable if either the forward power Pf1 or the reflected power Pr1 is within an uncertainty range. In addition, the high-frequency measuring device 5 may also be evaluated as being reliable if the forward power Pf1 is within the uncertainty range or may be evaluated as being reliable if the reflected power Pr1 is within the uncertainty range.

On the other hand, in the case the range of the difference between forward power Pf3 and forward power Pf4 is narrower, the control device 9 evaluates reliability of the high-frequency measuring device 5 based on whether or not the difference between the forward power Pf1 and the reflected power Pr1 (Pf1−Pr1) is within the range between the forward power Pf3 and the forward power Pf4. In the present embodiment, the control device 9 evaluates the high-frequency measuring device 5 as being reliable only in the case the difference (Pf1−Pr1) is within the range between the forward power Pf3 and the forward power Pf4. Furthermore, since the arrangement of the elements of the impedance conversion device 3 and the arrangement of the elements of the impedance conversion device 6 are mutually symmetrical, a common element is used for each element, and the capacitances of corresponding variable capacitors are adjusted in the same manner, electrical power consumed by the impedance conversion device 3 and electrical power consumed by the impedance conversion device 6 have similar values. Thus, the difference between forward power Pf1 and reflected power Pr1 (Pf1−Pr1) measured by the high-frequency measuring device 5 arranged between the impedance conversion device 3 and the impedance conversion device 6 is close to the median value of the forward power Pf3 and the forward power Pf4. Thus, measurement accuracy of the high-frequency measuring device 5 may be evaluated as being within an acceptable range only in the case the difference (Pf1−Pr1) is within a prescribed range centered on the median value of the forward power Pf3 and the forward power Pf4.

The median value of Pf3 and Pf4 is (Pf3+Pf4)/2. The applicable median value and the median value of Pf3 and Pf4 respectively become (Pf3+(Pf3+Pf4)/2)/2=(3·Pf3+Pf4)/4 and ((Pf3+Pf4)/2+Pf4)/2=(Pf3+3·Pf4)/4. For example, the high-frequency measuring device 5 may be evaluated as being reliable on the case the difference (Pf1−Pr1) is within the range from (3·Pf3+Pf4)/4 to (Pf3+3·Pf4)/4 centered on the median value of Pf3 and Pf4 of (Pf3+Pf4)/2.

Furthermore, in the case the width of the uncertainty range of the difference between forward power Pf2 and reflected power Pr2 is the same as the width of the range between forward power Pf3 and forward power Pf4, either method may be used for evaluation. Furthermore, evaluation is carried out using the latter method in the present embodiment.

Furthermore, as shown in the equation (6), the absolute values of the uncertainty of forward power ±FPU and the uncertainty of reflected power ±RPU become smaller and the uncertainty range becomes narrower the smaller the reflection coefficient ρl of the load as viewed from the directional coupler. Thus, a load having a small reflection coefficient is used in the case of severely evaluating reliability. In addition, in the case power consumption of the impedance conversion device 3 and the impedance conversion device 6 is small, the difference between forward power Pf3 and forward power Pf4 becomes smaller and the range between forward power Pf3 and forward power Pf4 becomes narrower. Thus, in the case of severely evaluating reliability, power consumption of the impedance conversion device 3 and the impedance conversion device 6 is reduced, or in other words, the output electrical power of the high-frequency power supply device 1 is reduced or current flow is reduced.

Figure 6:
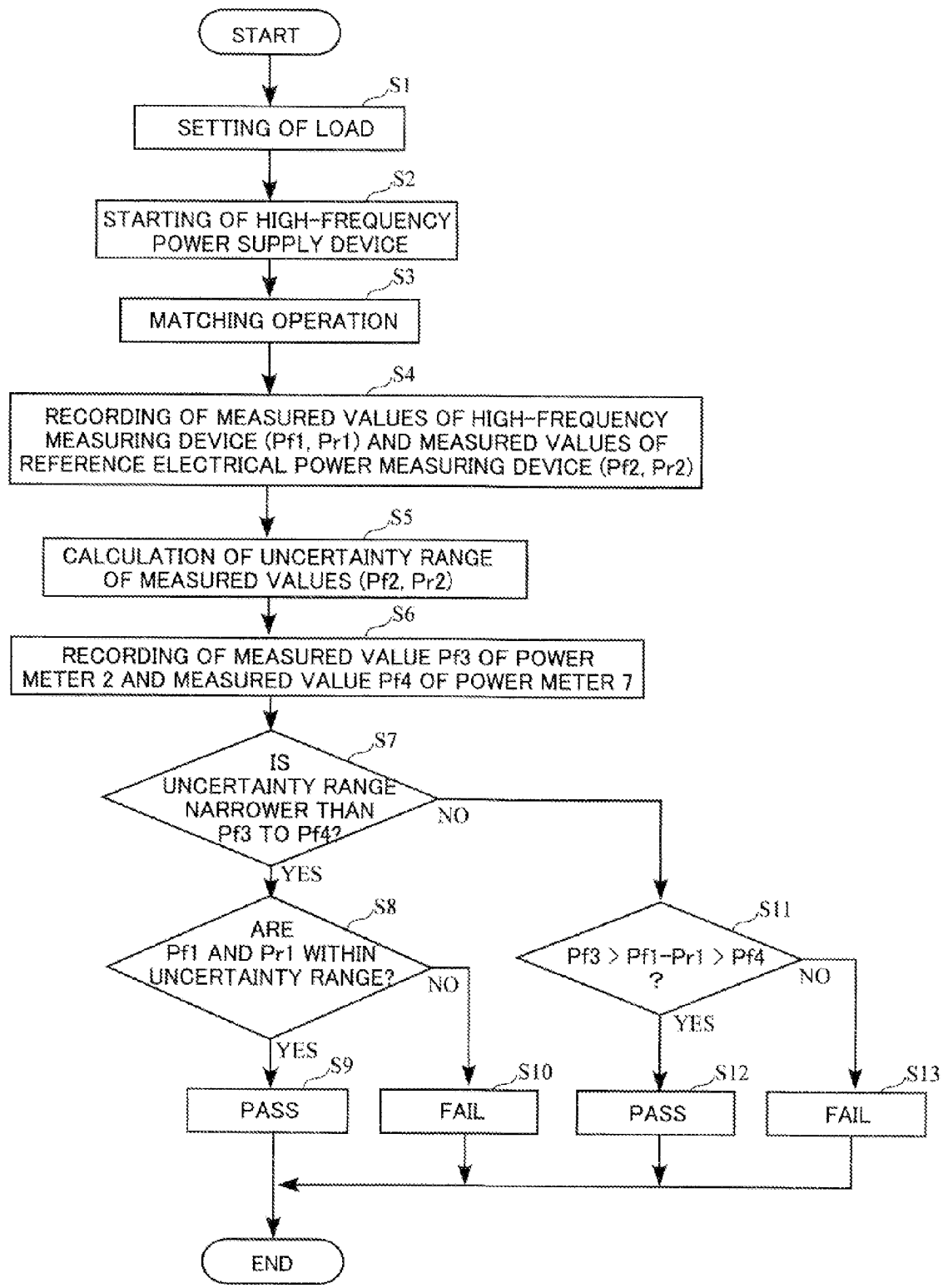
FIG. 6 is a flow chart for explaining the procedure of an evaluation method according to a first embodiment.

Next, an explanation is provided of the procedure for evaluating reliability of the high-frequency measuring device 5 with reference to the flow chart shown in FIG. 6.

FIG. 6 is a flow chart for explaining the procedure of the evaluation method according to the first embodiment. This flow chart indicates the processing procedure carried out by the control device 9 in the case of evaluating reliability of the high-frequency measuring device 5 using the evaluation system A shown in FIG. 2 in an inspection process of the manufactured high-frequency measuring device 5.

As was previously described, adjustment values of the capacitances C3 and C4 for enabling the impedance conversion device 6 to reproduce a desired complex impedance are set in advance. First, in the evaluation system A shown in FIG. 2, the adjustment positions of the variable capacitors VC3 and VC4 of the impedance conversion device 6 are adjusted to set positions (adjusted to the adjustment values set for the capacitances C3 and C4), an impedance as viewed from the input end c of the high-frequency measuring device 5 towards the side of the reference load 8 is set to a desired complex impedance (S1), and the high-frequency power supply device 1 is started (S2). Next, the adjustment positions of the variable capacitors VC1 and VC2 of the impedance conversion device 3 are adjusted, and an impedance as viewed from the output end a of the high-frequency power supply device 1 towards the side of the reference load 8 is adjusted to a characteristic impedance (S3). This adjustment is carried out by adjusting the adjustment positions of the variable capacitors VC1 and VC2 so that the reflected power Pr3 measured by the power meter 2 and the reflected power Pr4 measured by the power meter 7 are at zero. Furthermore, operation for carrying out this adjustment is referred to as a "matching operation" in the following description and in the flow chart of FIG. 6.

When the matching operation has been completed, namely when the reflected power Pr3 and the reflected power Pr4 are at zero, the forward power Pf1 and the reflected power Pr1 measured by the high-frequency measuring device 5, and the forward power Pf2 and the reflected power Pr2 measured by the reference electrical power measuring device 4 are recorded in memory (not shown) in the control device 9 (S4). Next, the uncertainty ranges of the forward power Pf2 and the reflected power Pr2 are respectively calculated from the pre-calculated uncertainty of the reference electrical power measuring device 4 (forward power uncertainty ±FPU and reflected power uncertainty ±RPU) and the forward power Pf2 and reflected power Pr2 (S5). The range from Pf2·(100−FPU)/100 to Pf2·(100+FPU)/100 is calculated as the uncertainty range of forward power Pf2, while the range from Pr2·(100−RPU)/100 to Pr2·(100+RPU)/100 is calculated as the uncertainty range of reflected power Pr2. In addition, at this time, the range from Pf2·(100−FPU)/100−Pr2·(100+RPU)/100 to Pf2·(100+FPU)/100−Pr2·(100−RPU)/100 is calculated as the uncertainty range of the difference between forward power Pf2 and reflected power Pr2.

In addition, when the matching operation is completed, forward power Pf3 measured by the power meter 2 and forward power Pf4 measured by the power meter 7 are recorded in memory in the control device 9 (S6). Furthermore, the order in which step S6 is carried out is not limited to being carried out after step S5, but rather may be carried out before step S4 or between step S4 and step S5.

Next, a judgment is made as to which of the ranges of the uncertainty range of the difference between forward power Pf2 and reflected power Pr2 calculated in step S5 and the range between forward power Pf3 and forward power Pf4 recorded in step S6 is narrower (S7). More specifically, this judgment is made by comparing the width of the uncertainty range of the difference between forward power Pf2 and reflected power Pr2 with the difference between forward power Pf3 and forward power Pf4. The width of the uncertainty range of the difference between forward power Pf2 and reflected power Pr2 is Pf2·(100+FPU)/100−Pr2·(100−RPU)/100−{Pf2·(100−FPU)/100−Pr2·(100+RPU)/100}=Pf2·FPU·(1/50)+Pr2·RPU·(1/50). For example, in the case ±FPU=±RPU=±5%, the width of the uncertainty range of the difference between forward power Pf2 and reflected power Pr2 becomes Pf2·(1/10)+Pr2·(1/10). In the case the width of the uncertainty range of the difference between forward power Pf2 and reflected power Pr2 is smaller than the difference between forward power Pf3 and forward power Pf4, the uncertainty range of the difference between forward power Pf2 and reflected power Pr2 is judged to be narrower than the range between forward power Pf3 and forward power Pf4.

In the case the uncertainty range of the difference between forward power Pf2 and reflected power Pr2 has been judged to be narrower than the range between forward power Pf3 and forward power Pf4 (YES in S7), a judgment is made as to whether or not forward power Pf1 is within the uncertainty range of forward power Pf2 and whether or not reflected power Pr1 is within the uncertainty range of reflected power Pr2 (S8). In the case either forward power Pf1 or reflected power Pr1 is within an uncertainty range (YES in S8), the high-frequency measuring device 5 is evaluated as being reliable, and a message indicating that the device has passed inspection is displayed on a display unit not shown of the control device 9 (S9). In this case, the high-frequency measuring device 5 is advanced to the next step as an acceptable product. On the other hand, in the case neither forward power Pf1 or reflected power Pr1 is within an uncertainty range (NO in S8), the high-frequency measuring device 5 is evaluated as being unreliable, and a message indicating that it failed inspection is displayed on the display unit (S10). In this case, the high-frequency measuring device 5 is subjected to processing such as re-calibration as an unacceptable product.

In the case the uncertainty range of the difference between forward power Pf2 and reflected power Pr2 has been judged to be narrower than the range between forward power Pf3 and forward power Pf4 (NO in S7), a judgment is made as to whether or not the difference between forward power Pf1 and reflected power Pr1 (Pf1−Pr1) is within the range between forward power Pf3 and forward power Pf4 (S11). In the case the difference (Pf1−Pr1) is within the range between forward power Pf3 and forward power Pf4, namely in the case Pf3>(Pf1−Pr1)>Pf4 (YES in S11), the high-frequency measuring device 5 is evaluated as being reliable and a message indicating that the device has passed inspection is displayed on the display unit (S12). On the other hand, in the case the difference (Pf1−Pr1) is not within the range between forward power Pf3 and forward power Pf4 (NO in S11), the high-frequency measuring device 5 is evaluated as being unreliable, and a message indicating that it failed inspection is displayed on the display unit (S13).

Furthermore, although it has been described above that reliability of the high-frequency measuring device 5 is evaluated based only on measured values of the high-frequency measuring device 5 when a single complex impedance is reproduced and the high-frequency measuring device 5 is connected to a load having that complex impedance, the present embodiment is not limited thereto. Reliability of the high-frequency measuring device 5 may also be evaluated after reproducing a plurality of complex impedances and judging each impedance. Namely, after making the judgment of step S8 or step S11, a process consisting of returning to step S1, setting a different load and judging reliability of the high-frequency measuring device 5 may be repeated a plurality of times. In this case, the high-frequency measuring device 5 may be evaluated as being reliable only in the case measured values of the high-frequency measuring device 5 have been judged to be reliable in all judgments. The high-frequency measuring device 5 may also be evaluated as being reliable in the case the number of times measured values of the high-frequency measuring device 5 have been judged to be reliable is equal to or greater than a prescribed number of times.

Furthermore, although the above description has explained the case of presetting each step in the control device 9 and the control device 9 carrying out each step automatically, the present embodiment is not limited thereto. Each step may also be made to be carried out by a worker. In addition, some of the steps may be allowed to be carried out by a worker, while the other steps may be carried out automatically by the control device 9.

Furthermore, reliability of the high-frequency measuring device 5 may also be evaluated using the same procedure as that shown in the flow chart other than in an inspection process during production.

As has been described above, if the impedance conversion device 6 is set in advance so that an impedance as viewed from the input end c of the high-frequency measuring device 5 towards the side of the reference load 8 becomes a desired complex impedance, the state in which the high-frequency measuring device 5 is connected to, for example, an actually used plasma processing device can be reproduced. Reliability of the high-frequency measuring device 5 is evaluated based on whether or not the forward power Pf1 and reflected power Pr1 measured by the high-frequency measuring device 5 while in this reproduced state is respectively within the uncertainty range of the forward power Pf2 and the reflected power Pr2 measured by the reference electrical power measuring device 4. Namely, the high-frequency measuring device 5 is evaluated as being reliable only in the case both the forward power Pf1 and the reflected power Pr1 are within the uncertainty range. Thus, reliability of the high-frequency measuring device 5 used for a load other than that having a characteristic impedance can be evaluated. As a result, electrical power measured values measured by the high-frequency measuring device 5 can be guaranteed to be reliable. In addition, inspection for unacceptable products can be carried out preferably by evaluating reliability of the high-frequency measuring device 5 during production of the high-frequency measuring device 5.

In addition, a judgment is made as to which of the ranges of the uncertainty range of the difference between forward power Pf2 and reflected power Pr2 input from the reference electrical power measuring device 4 and the range between the forward power Pf3 input from the power meter 2 and the forward power Pf4 input from the power meter 7 is narrower when the reflected power Pr3 input from the power meter 2 and the reflected power Pr4 input from the power meter 7 are at zero. In the case the uncertainty range of the difference between forward power Pf2 and reflected power Pr2 is narrower, an evaluation is made as to whether or not reflected power Pf1 and reflected power Pr1 are respectively within the uncertainty range, while in the case the range between forward power Pf3 and forward power Pf4 is narrower, an evaluation is made as to whether or not the difference (Pf1−Pr1) between forward power Pf1 and reflected power Pr1 is within the range between forward power Pf3 and forward power Pf4. Thus, reliability of the high-frequency measuring device 5 is evaluated under stricter conditions. As a result, the accuracy of measured values measured by the high-frequency measuring device 5 can be guaranteed at a higher level. In addition, inspection of unacceptable products of the produced high-frequency measuring device 5 can be carried out more severely.

Furthermore, although the above description of the present embodiment explained the case of evaluating reliability of the high-frequency measuring device 5, the present embodiment is not limited thereto. The present invention makes it possible to evaluate reliability of an electrical power measuring device other than the high-frequency measuring device 5 (such as an electrical power measuring device provided with a directional coupler). In this case, an electrical power measuring device desired to be evaluated is arranged in the evaluation system A shown in FIG. 1 instead of the high-frequency measuring device 5, and evaluation is carried out in accordance with the flow chart shown in FIG. 6.

Furthermore, although the present embodiment as described above is configured so that the method used to evaluate reliability differs based on whether or not the uncertainty range of the difference between forward power Pf2 and reflected power Pr2 is within the range between forward power Pf3 and forward power Pf4, the present embodiment is not limited thereto. For example, the uncertainty range of forward power Pf2 or the uncertainty range of reflected power Pr2 may be compared with the range between forward power Pf3 and forward power Pf4, or both the uncertainty range of forward power Pf2 and the uncertainty range of reflected power Pr2 may be compared with the range between forward power Pf3 and forward power Pf4.

In addition, reliability of the high-frequency measuring device 5 may also be evaluated based on whether or not the difference (Pf1−Pr1) is within the range between forward power Pf3 and forward power Pf4 without comparing both ranges. Namely, processing may proceed from step S6 to step S11 while omitting step S7 in the flow chart shown in FIG. 6. In this case, the reference electrical power measuring device 4 can be omitted from the configuration of the evaluation system A. Conversely, reliability of the high-frequency measuring device 5 may also be evaluated based on whether or not forward power Pf1 and reflected power Pr1 are respectively within the uncertainty range of forward power Pf2 and reflected power Pr2 without comparing both ranges. In this case, since it is no longer necessary to measure forward power Pf3 and forward power Pf4, the evaluation system A can be further simplified. The following provides an explanation of the case of evaluating the reliability of the high-frequency measuring device 5 using a simplified version of the evaluation system A in the form of an evaluation system A' as a second embodiment of the present invention.

Figure 7:
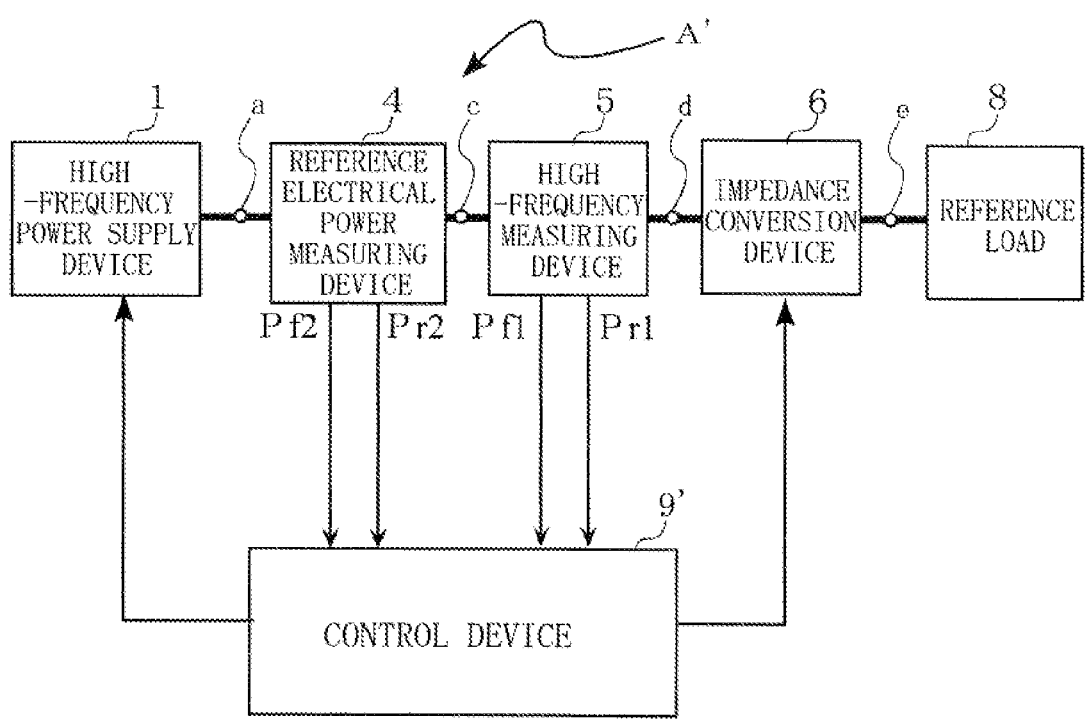
FIG. 7 is a drawing showing an example of an evaluation system for carrying out a second embodiment of the evaluation method according to the present invention.

FIG. 7 is a block diagram for explaining the evaluation system A' for carrying out the second embodiment of the method for evaluating reliability of an electrical power measuring device according to the present invention. Furthermore, in this drawing, the same reference symbols are used to indicate those elements that are either identical or similar to elements of the evaluation system A shown in FIG. 1.

As was explained in FIG. 1, although the evaluation method according to the first embodiment consists of evaluating reliability of the high-frequency measuring device X by using the stricter evaluation criteria among two evaluation criteria consisting of the uncertainty range of measured values of the reference electrical power measuring device Y and the electrical power measuring range between an output electrical power Pf3 of the high-frequency power supply E and input electrical power Pf4 input to the termination resistor Ro, in the evaluation method of the second embodiment, reliability of the high-frequency measuring device X is evaluated using only the uncertainty range of electrical power measured values of the reference electrical power measuring device Y for the evaluation criterion.

In the evaluation method according to the second embodiment, the configuration of the evaluation system can be correspondingly simplified since the output electrical power Pf3 of the high-frequency power supply E and the input electrical power Pf4 input to the termination resistor Ro are not measured. In this sense, the evaluation method according to the second embodiment can be said to be a simplified version of the evaluation method according to the first embodiment.

The evaluation system A' shown in FIG. 7 differs from the evaluation system A shown in FIG. 2 in that the power meters 2 and 7 and the impedance conversion unit 3 are omitted and that the function of the control device 9' is simplified.

The control device 9' controls the evaluation system A'. The control device 9' evaluates reliability of the high-frequency measuring device 5 by respectively inputting measured values of forward power and reflected power from the reference electrical power measuring device 4 and the high-frequency measuring device 5, and then displays the evaluation result on a display device not shown. The control device 9' respectively calculates the uncertainty ranges from the forward power Pf2 and the reflected power Pr2 measured by the reference electrical power measuring device 4, and evaluates reliability of the high-frequency measuring device 5 based on whether or not the forward power Pf1 and the reflected power Pr1 measured by the high-frequency measuring device 5 are respectively within the uncertainty range of the forward power Pf2 and the reflected power Pr2. In the present embodiment, the control device 9' evaluates the high-frequency measuring device 5 as being reliable only in the case the forward power Pf1 is within the uncertainty range of the forward power Pf2 and the reflected power Pr1 is within the uncertainty range of the reflected power Pr2. Furthermore, evaluation of reliability is not limited thereto. For example, the high-frequency measuring device 5 may be evaluated as being reliable if the forward power Pf1 or the reflected power Pr1 is within the uncertainty range. In addition, the high-frequency measuring device 5 may also be evaluated as being reliable if the forward power Pf1 is within the uncertainty range, or may be evaluated as being reliable if the reflected power Pr1 is within the uncertainty range.

Figure 8:
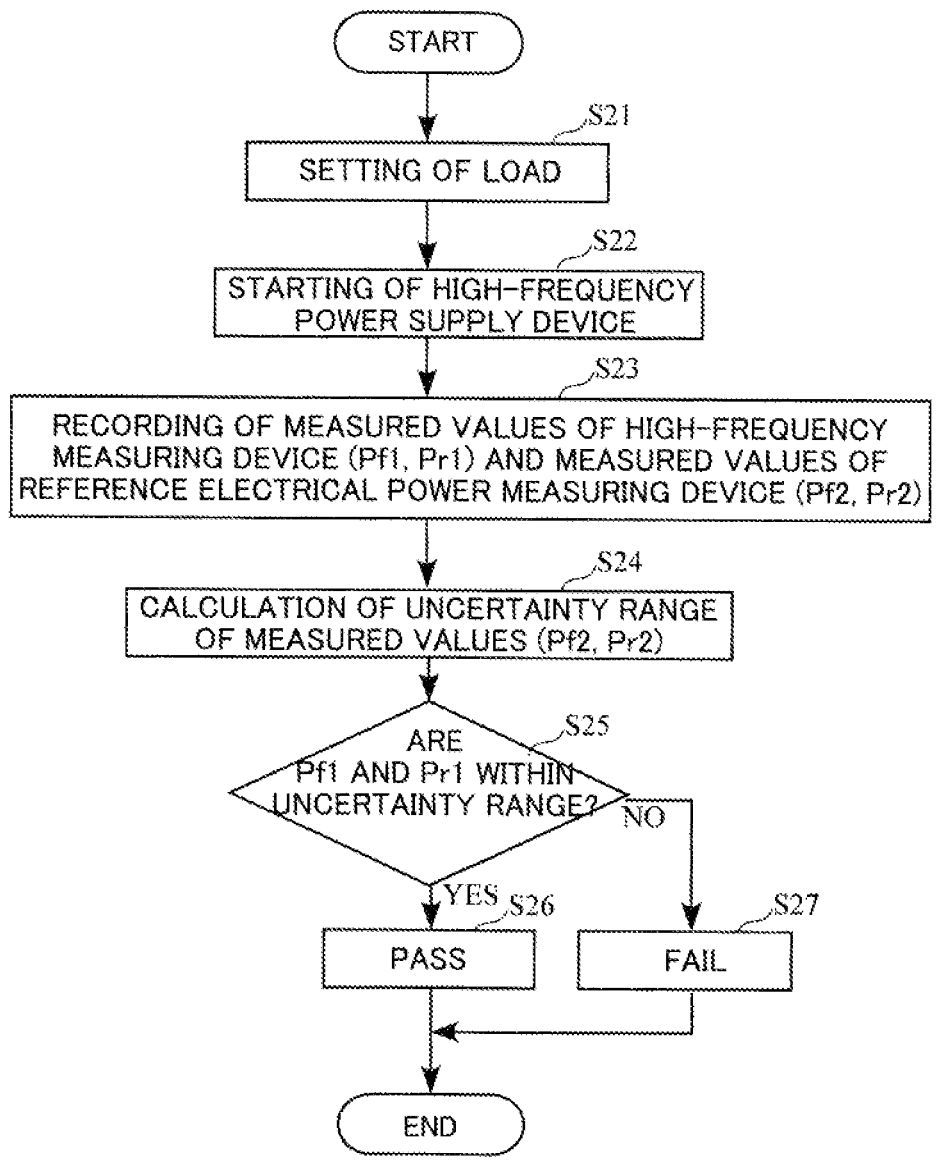
FIG. 8 is a flow chart for explaining the procedure of an evaluation method according to a second embodiment.

Next, an explanation is provided of the procedure for carrying out a method for evaluating the measurement accuracy of the high-frequency measuring device 5 by using the evaluation system A' with reference to the flow chart shown in FIG. 8.

Before evaluating reliability of the high-frequency measuring device 5, it is necessary to preset the impedance conversion device 6 so that it is able to reproduce a desired complex impedance. Since the method of setting the impedance conversion device 6 is the same as in the case of the evaluation system A, an explanation thereof is omitted here.

First, in the evaluation system A' shown in FIG. 7, the adjustment positions of the variable capacitors VC3 and VC4 of the impedance conversion device 6 are adjusted to set positions, an impedance as viewed from the input end c of the high-frequency measuring device 5 towards the side of the reference load 8 is set to a desired complex impedance (S21), and the high-frequency power supply device 1 is started (S22). Next, the forward power Pf1 and the reflected power Pr1 measured by the high-frequency measuring device 5 and the forward power Pf2 and the reflected power Pr2 measured by the reference electrical power measuring device 4 are recorded in memory (not shown) in the control device 9' (S23). Next, the uncertainty ranges of the forward power Pf2 and the reflected power Pr2 are calculated from the pre-calculated uncertainty of the reference electrical power measuring device 4 (forward power uncertainty ±FPU and reflected power uncertainty ±RPU) and the forward power Pf2 and reflected power Pr2 (S24).

Next, a judgment is made as to whether or not forward power Pf1 is within the uncertainty range of forward power Pf2 and whether or not reflected power Pr1 is within the uncertainty range of reflected power Pr2 (S25). In the case either forward power Pf1 or reflected power Pr1 is within an uncertainty range (YES in S25), the high-frequency measuring device 5 is evaluated as being reliable, and a message indicating that the device has passed inspection is displayed on a display unit not shown of the control device 9' (S26). In this case, the high-frequency measuring device 5 is advanced to the next step as an acceptable product. On the other hand, in the case neither forward power Pf1 or reflected power Pr1 is within an uncertainty range (NO in S25), the high-frequency measuring device 5 is evaluated as being unreliable, and a message indicating that it failed inspection is displayed on the display unit (S27). In this case, the high-frequency measuring device 5 is subjected to processing such as re-calibration as an unacceptable product.

Furthermore, although it has been described above that reliability of the high-frequency measuring device 5 is evaluated based only on measured values of the high-frequency measuring device 5 when a single complex impedance is reproduced and the high-frequency measuring device 5 is connected to a load having that complex impedance, the present embodiment is not limited thereto. Reliability of the high-frequency measuring device 5 may also be evaluated after reproducing a plurality of complex impedances and judging each impedance. Namely, after making the judgment of step S25, a process consisting of returning to step S21, setting a different load and judging reliability of the high-frequency measuring device 5 may be repeated a plurality of times. In this case, the high-frequency measuring device 5 may be evaluated as being reliable only in the case measured values of the high-frequency measuring device 5 have been judged to be reliable in all judgments, or the high-frequency measuring device 5 may be evaluated as being reliable in the case the number of times measured values of the high-frequency measuring device 5 have been judged to be reliable is equal to or greater than a prescribed number of times.

Furthermore, although the above description has explained the case of presetting each step in the control device 9' and the control device 9' carrying out each step automatically, the present embodiment is not limited thereto. Each step may also be made to be carried out by a worker. In addition, some of the steps may be allowed to be carried out by a worker, while the other steps may be carried out automatically by the control device 9'.

In the second embodiment as well, reliability of the high-frequency measuring device 5 used for a load other than that having a characteristic impedance can be evaluated. In addition, the evaluation system A' can be made to be a simpler system having fewer constituent members than the evaluation system A, and accuracy of electrical power measured values of the high-frequency measuring device 5 can be evaluated using a simpler method than in the case of the first embodiment.

According to the equation (6), the absolute values of the uncertainty of forward power ±FPU and the uncertainty of reflected power ±RPU become smaller and the uncertainty ranges become narrower in the case the reflection coefficient $\rho l$ of the load as viewed from the directional coupler is small. Thus, an adequately suitable evaluation can be made based only on a judgment of whether or not values lie within the uncertainty ranges. Thus, the simpler second embodiment is suitable in cases of evaluating the accuracy of electrical power measured values of the high-frequency measuring device 5 used for a load having a small reflection coefficient $\rho l$. Conversely, the uncertainty ranges become large in the case the reflection coefficient $\rho l$ of the load is large. Thus, the first embodiment is suitable for carrying out evaluations under stricter conditions. In addition, since reflected power from the load becomes large in the second embodiment in the case the reflection coefficient $\rho l$ of the load is large, the range of output electrical power is restricted by the allowable range of the high-frequency power supply device 1 relative to reflected power. Thus, the first embodiment is suitable since reflected power from the impedance conversion device 3 is adjusted to zero and there are no restrictions on the output electrical power of the high-frequency power supply device 1.

The method for evaluating reliability of electrical power measuring devices according to the present invention is not limited to the above-mentioned embodiments. In addition, the design of the specific configuration of each portion of the evaluation system for the evaluation method according to the present invention can be modified in various ways.

The invention claimed is:

1. In a plasma processing system, a method of evaluating the reliability of measured values obtained by an electrical power measuring device that is connected to a connection point between a high-frequency power supply device and a load having a complex impedance, the electrical power measuring device being configured to measure the high-frequency electrical power at the connection point, the method comprising:

terminating a transmission line of high-frequency electrical power output from the high-frequency power supply device at a reference load having an impedance equal to a characteristic impedance of the transmission line, arranging an electrical power measuring device to be evaluated and a reference electrical power measuring device enabling calculation of the uncertainty of an electrical power measured value in the transmission line, arranging, after the electrical power measuring device to be evaluated and the reference electrical power measuring device, a first impedance conversion device that converts an impedance so that an impedance as viewed towards the reference load side becomes the complex impedance generated in the plasma processing system together with arranging a first electrical power measuring device that measures electrical power input to the reference load between the first impedance conversion device and the reference load, and arranging, before the electrical power measuring device to be evaluated and the reference electrical power measuring device, a second impedance conversion device that converts an impedance so that an impedance as viewed towards the reference load side becomes the characteristic impedance together with arranging a second electrical power measuring device that measures electrical power output from the high-frequency power supply device between the second impedance conversion device and the high-frequency power supply device;

calculating an uncertainty range of the electrical power measured value, according to a prescribed calculation formula, from an electrical power measured value measured by the reference electrical power measuring device and the uncertainty of the reference electrical power measuring device, and calculating a prescribed electrical power measuring range based on an electrical power measured value measured by the first electrical power measuring device and an electrical power measured value measured by the second electrical power measuring device; and evaluating the reliability of the measured value measured by the electrical power measuring device to be evaluated based on the electrical power measured value measured by the electrical power measuring device to be evaluated, the uncertainty range of the electrical power measured value of the reference electrical power measuring device, and the prescribed electrical power measuring range, wherein a judgment is made as to whether the uncertainty range of the electrical power measured value of the reference electrical power measuring device is narrower than the prescribed electrical power measuring range, in the case the uncertainty range is narrower than the prescribed electrical power measuring range, the electrical power measuring device to be evaluated is evaluated as being reliable if the electrical power measured value of the electrical power measuring device to be evaluated is within the uncertainty range of the electrical power measured value of the reference electrical power measuring device, and in the case the uncertainty range is not narrower than the prescribed electrical power measuring range, the electrical power measuring device to be evaluated is evaluated as being reliable if a difference between a measured value of forward power transmitted to the side of the reference load, which is the electrical power measured value of the electrical power measuring device to be evaluated, and a measured value of reflected power transmitted to the side of the high-frequency power supply device, is within the prescribed electrical power measuring range, and, in the case the electrical power measuring device to be evaluated is determined to not be reliable, re-calibrating the electrical power measuring device to be evaluated, and the reference electrical power measuring device comprises a directional coupler, and the uncertainty of the reference electrical power measuring device corresponds to an uncertainty of the directional coupler.

2. The evaluation method according to claim 1, wherein the prescribed electrical power measuring range is a range between an electrical power measured value of the first electrical power measuring device and an electrical power measured value of the second electrical power measuring device.

3. The evaluation method according to claim 1, wherein the prescribed electrical power measuring range is a prescribed range centered on a median value of an electrical power measured value of the first electrical power measuring device and an electrical power measured value of the second electrical power measuring device.

4. The evaluation method according to claim 1, wherein forward power and reflected power separated with the directional coupler are respectively measured by the reference electrical power measuring device.

5. The evaluation method according to claim 1, wherein the electrical power measuring device to be evaluated is a high-frequency measuring device that measures a high-frequency voltage and a high-frequency current, and calculates at least one of a phase difference between the high-frequency voltage and the high-frequency current, an impedance, a reflection coefficient, forward power or reflected power from these measured values.

* * * * *